(12) United States Patent
Nakatsu et al.

(10) Patent No.: US 6,486,548 B1
(45) Date of Patent: Nov. 26, 2002

(54) SEMICONDUCTOR MODULE AND POWER CONVERTING APPARATUS USING THE MODULE

(75) Inventors: Kinya Nakatsu, Hitachi (JP); Toshio Ogawa, Hitachinaka (JP); Akihiro Tamba, Hitachi (JP); Hiroshi Fujii, Chiba (JP); Hiroyuki Tomita, Funabashi (JP); Norinaga Suzuki, Sakura (JP); Kazuhiro Ito, Chiba (JP); Masahiro Hiraga, Yotsukaido (JP)

(73) Assignees: Hitachi, Ltd., Tokyo (JP); Hitachi Keiyo Engineering Co., Ltd., Narashimo (JP)

( * ) Notice: Subject to any disclaimer, the term of this patent is extended or adjusted under 35 U.S.C. 154(b) by 0 days.

(21) Appl. No.: 09/529,800
(22) PCT Filed: Oct. 12, 1998
(86) PCT No.: PCT/JP98/04578
§ 371 (c)(1),
(2), (4) Date: Apr. 20, 2000
(87) PCT Pub. No.: WO99/21228
PCT Pub. Date: Apr. 29, 1999

(30) Foreign Application Priority Data
Oct. 20, 1997 (JP) .............................. 9-286516

(51) Int. Cl.$^7$ ............................ H01L 23/48; H01L 23/52
(52) U.S. Cl. ..................... 257/690; 257/696; 257/698; 257/729
(58) Field of Search ................................ 257/678–733, 257/787–796

(56) References Cited

U.S. PATENT DOCUMENTS 5,886,876 A * 3/1999 Yamaguchi ................. 361/767
6,191,492 B1 * 2/2001 Yamazaki et al. .......... 257/787

* cited by examiner

Primary Examiner—Ngân V. Ngô
(74) Attorney, Agent, or Firm—Antonelli, Terry, Stout & Kraus, LLP

(57) ABSTRACT

A semiconductor module in which a lead electrode is integrally formed with or pressed into resin separated from a resin case, and a connector securing a pad for bonding a metal wire to the lead electrode is bonded to a substrate with a power semiconductor element mounted thereon by an adhesive, and the like in a similar manner as the module case. According to the present invention, an electrode can be disposed in an appropriate position in the semiconductor module, and the scope of the free layout is enhanced.

14 Claims, 10 Drawing Sheets

SEMICONDUCTOR MODULE AND POWER CONVERTING APPARATUS USING THE MODULE

TECHNICAL FIELD

The present invention relates to a semiconductor module and a power converting apparatus using the semiconductor module.

BACKGROUND ART

In recent years, for power semiconductor modules, a current capacity has been wide-ranged from several amperes to several thousands of amperes, a size has been reduced, and a cost has been lowered. In order to achieve the miniaturization, cost reduction and reliability enhancement, in these power semiconductor modules, a case and an electrode in which a part of the electrode is integrally formed with the resin portion in a module case (hereinafter referred to as the lead insert case) are used. As one example, a technique is described in Japanese Patent Unexamined Publication No. 07-263621. However, in the class of several amperes to several tens of amperes, since the miniaturization and special configuration of an application itself have been advanced, and the customizing of the module has been requested. Examples of requirements from the application include a module outer shape, height, electrode position, and the like, particularly the requirements for the electrode position differ with the respective applications and the insert case integrally provided with the electrode in which a peculiar layout is possible is required. For this purpose, dies for integrally forming the case and electrode and extracting the electrode have to be manufactured for each requirement, and enormous initial investment and development period have been necessary.

Moreover, in recent years, a module has also been proposed in which a general-purpose connector formed by outserting the electrode to resins such as polybutylene terephthalate (PBT) prepared separately from a module outer case resin is directly fixed, by using a solder, to a copper foil pattern disposed beforehand on an insulating layer in the module. In this case, the electrode can be disposed without being influenced by a module shape. Additionally, since the general-purpose connector is utilized, the cost can be reduced, the development period can be shortened, and custom requirements can be handled. However, since the electrode is fixed by the solder, the soldered part, the insulating layer right under the copper foil pattern and the like are destroyed by stresses applied to the solder between the electrode and the copper foil pattern, the copper foil pattern, and the insulating layer right under the copper foil pattern from the inside or outside of the module, thereby causing reliability deterioration such as insulation defect and wire breaking.

According to the above-described conventional art, the lead insert case is used to advance the miniaturization and reliability enhancement, while the general-purpose connector is used to lower the cost and shorten the development period.

However, in order to customize the power semiconductor module, when the lead, insert case is used, the scope of the free design is lowered, and the enormous initial investment and long development period are necessary. Moreover, when the general-purpose connector is used, there arises a problem that the reliability is deteriorated.

DISCLOSURE OF THE INVENTION

An object of the present invention is to provide a semiconductor module which avoids the deterioration of the scope of the free design of a custom module for various applications, reduces a size, lowers a cost, enhances a reliability and shortens a development period.

To solve the above-described problem, according to the present invention, there is provided a semiconductor module in which a lead electrode is covered with a resin member separated from a case, and a connector securing a space for bonding a metal wire to the electrode part is bonded to a substrate with a emiconductor element mounted thereon.

With such a connector, the electrode can be disposed in an appropriate position in the power semiconductor module without being largely influenced by a module case shape and the scope of free layout is improved, while the custom module can be provided without developing a lead insert case for each requirement from each application, which enables the cost reduction, reliability enhancement, initial investment reduction, and shortened development period.

Moreover, since the electric connection between the connector and a wiring pattern to connect the semiconductor element mounted on the semiconductor module to other circuit components is performed not by soldering, but by the bonding of the metal wire, the reliability against the wire breaking, insulation, and the like can be improved.

When the semiconductor module according to the present invention is applied to power converting apparatuses such as an inverter, the scope of the free arrangement of the semiconductor module and the substrate with other electric circuit components is increased. Therefore, the power converting apparatus can be miniaturized.

According to the present invention, there is provided another semiconductor module comprising: a resin case; a semiconductor element disposed in the resin case; a lead electrode electrically connected to the semiconductor element and extracted to the outside of the resin case; and a substrate with electric circuit components mounted thereon. Further, the substrate is positioned over the semiconductor element, and removably connected to the lead electrode. As a concrete constitution of the above semiconductor module, there is a structure that the substrate with the electric circuit components mounted thereon is removably connected to the lead electrode in the above described semiconductor module according to the present invention.

According to the present invention, there is provided another power converting apparatus comprising: a resin case, a semiconductor module provided with the resin case, a semiconductor element disposed in the resin case, and a lead electrode electrically connected to the semiconductor element and drawn to the outside of the resin case; and a substrate with electric circuit components mounted thereon. Further, the substrate is positioned above the semiconductor module, and removably connected to the lead electrode. As a concrete constitution of another power converting apparatus according to the present invention, the above-described concrete constitution of another semiconductor module of the present invention is applied.

With another semiconductor module and power converting apparatus according to the present invention, various types and series of the semiconductor modules and the power converting apparatuses can easily be obtained. Therefore, the costs of the semiconductor module and the power converting apparatus can be lowered.

BEST MODE FOR CARRYING OUT THE INVENTION

One embodiment according to the present invention will be described hereinafter with reference to the drawings.

Figure 1:
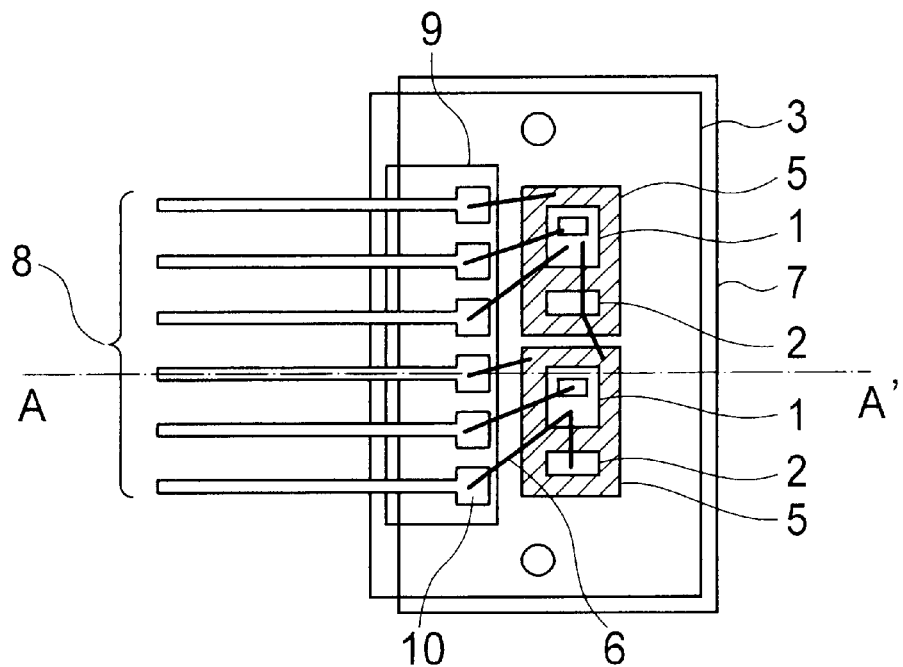
FIG. 1 is a top view showing a first embodiment.
Figure 2:
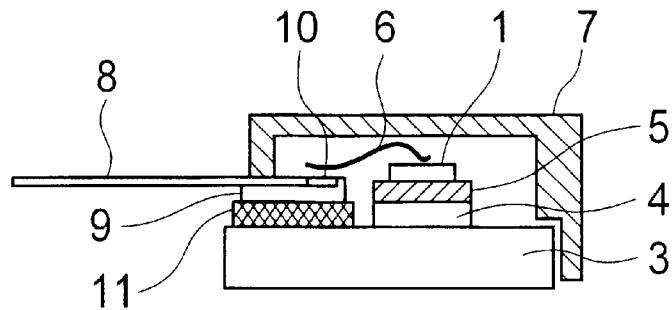
FIG. 2 is a sectional view taken along A–A' in FIG. 1.

FIG. 1 is a top view showing a first embodiment of a power semiconductor module according to the present invention, and FIG. 2 is a sectional view taken along A–A' line in FIG. 1.

In the power semiconductor module of FIG. 1, a plurality of transistors 1 and diodes 2 are attached to a plurality of insulating ceramic plates 4 of AlN or the like. The insulating ceramic plates 4 are arranged in the predetermined positions on a metal substrate 3. A method of mounting the metal substrate 3 and semiconductor elements disposed on the substrate is similar to that of a conventional power semiconductor module. Specifically, on the metal substrate 3, the plurality of the insulating ceramic plates 4 of AlN or the like are fixed to the metal substrate 3 by solder. Fixed on the insulating ceramic plate 4 is a foil conductor pattern 5 for connecting the main electrodes and control electrodes of the transistor 1 and diode 2. The transistor 1 and diode 2 are fixed onto the foil conductor pattern 5 by the solder. The electrode of each semiconductor element and the foil conductor pattern 5 are connected to an electrode 8 fixed to a resin case 7 by wire bonding of a metal wire 6. The electrode 8 is a lead electrode to electrically connect a module internal circuit to a modules external part.

The present embodiment is characterized in that as shown in FIGS. 1 and 2, a connector obtained by integrally forming the electrode 8 and a resin member 9 separated from the resin case 7 or pressing the former into the latter is disposed as a component. The surface opposite to the contact surface of the connector and the metal substrate 3 is provided, by using a part of the electrode 8, with a pad 10 to which the metal wire 6 can be bonding-connected. The resin member 7 of the connector is bonded to the metal substrate 3 by a silicon resin-based adhesive material 11. The foil conductor pattern 5 and semiconductor element on the insulating ceramic plate 4 is electrically connected to the pad 10 by the wire bonding with the metal wire 6.

Specifically, in the present embodiment, mechanical fixing means (adhesive material) in the electrode 8 is different from electric connecting means (wire) therein.

Since the above-described connector is used, a conventional process of soldering the electrode 8 and the foil conductor pattern 5 can be omitted, thereby avoiding the reliability deterioration such as the destruction of the soldered surface and insulating layer by the stress generated in the soldered part. Moreover, since the connector is fixed by the adhesive material, and the electrode 8 is not directly incorporated in the resin case 7, the connector position can easily be changed without changing the resin case 7. Therefore, the layout change of the electrode 8 is facilitated. Moreover, the adaptation of the module outer configuration to clients does not require the change of the electrode 8 with the change of the resin case 7. Specifically, since the module components other than the outer case can be constituted in common, the cost reduction, and short period for delivery can be achieved. Moreover, since the electric connection in the electrode 8 is performed by the wire bonding without using the conductive bonding materials such as the solder, the soldering layer of the electrode soldered part, the foil conductor pattern, and the insulating ceramic plate are prevented from being destroyed by the stresses applied to the electrode 8 from the inside or outside of the module. Therefore, the reliability of the power semiconductor module is enhanced.

Preferably, rigid resins such as polyphenylene sulfide (PPS) are used in the resin member 9 of the connector to secure a strength. Moreover, the thickness of the resin part right under the pad 10 is of the order of 1 mm to 20 mm to enhance the bonding reliability. Copper is used as the material of the electrode 8, and the copper surface of the pad 10 is plated with metal which hardly rusts, so that the reliability is further enhanced.

Figure 3:
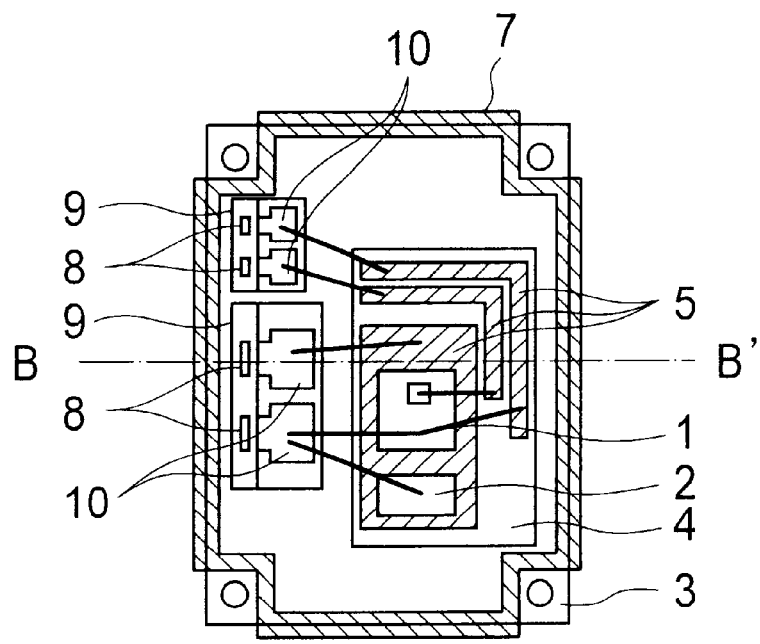
FIG. 3 is a top view showing a second embodiment.
Figure 4:
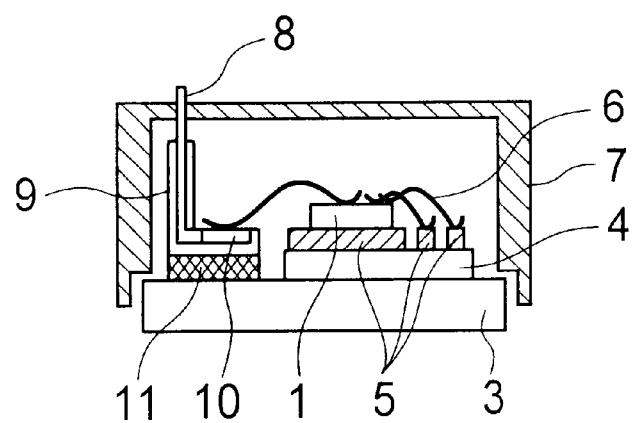
FIG. 4 is a sectional view taken along B–B' in FIG. 3.

FIG. 3 is a top view showing a second embodiment of the power semiconductor module according to the present invention, and FIG. 4 is a sectional view taken along a B–B' line in FIG. 3.

The embodiment in FIGS. 3 and 4 is different from the above-described embodiment in FIG. 1 in that the part of the lead electrode 8 covered with the resin member 9 is bent upward with respect to the surface of the pad 10, and the connector is directed to the top surface of the module. Here, the external connecting part in which the lead electrode 8 is exposed is extracted from the top surface of the resin case 7. This can increase the scope of the free connecting method to the external circuit and can miniaturize the application. Moreover, a plurality of types of connectors different in the shape and number of the electrode 8 and the shape of the pad 10 can be used like in the present embodiment.

According to the present embodiment, the layout can be realized in a minimum mounting area by considering an insulation distance necessary between the electrodes 8. Specifically, while the user's requirement with respect to the position of the electrode 8 is sufficiently reflected, the small-size low-cost module can be provided in a short period for delivery and the reliability can be enhanced.

Figure 5:
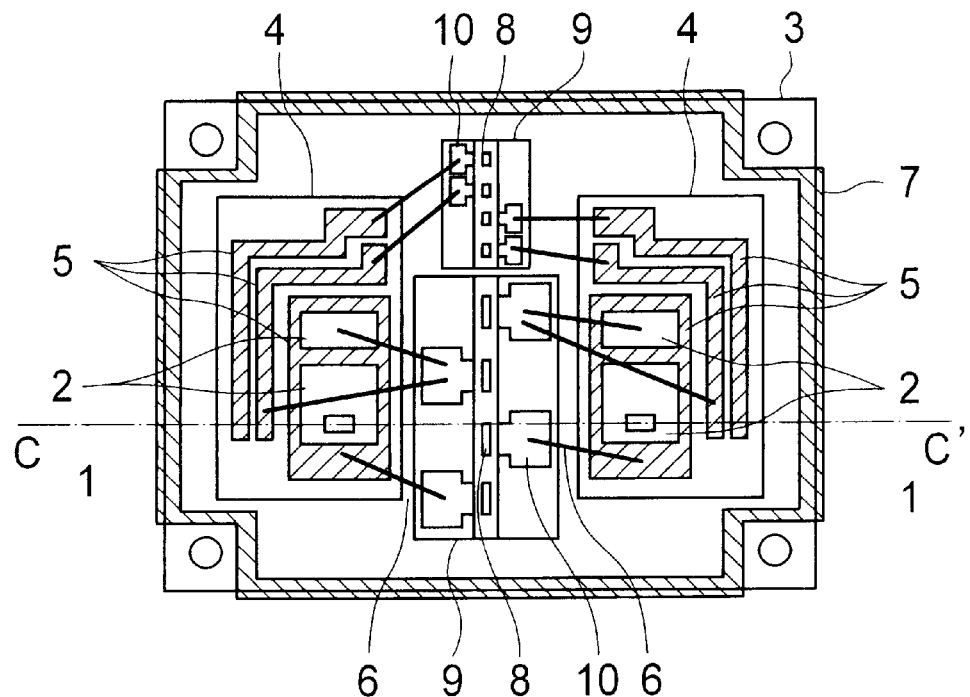
FIG. 5 is a top view showing a third embodiment.
Figure 6:
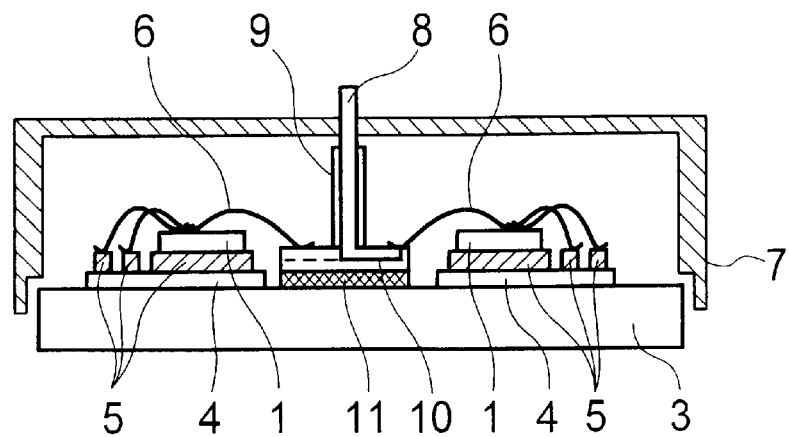
FIG. 6 is a sectional view taken along C–C' in FIG. 5.

FIG. 5 is a top view showing a third embodiment of the power semiconductor module according to the present invention, and FIG. 6 is a sectional view taken along a C–C' line in FIG. 5.

The embodiment in FIGS. 5 and 6 is different from the above-described embodiment in FIGS. 1 and 3 in that the electrodes 8 in the connector are bent upward with respect to the surface of the pads 10, and the pads are disposed on both sides of the bent part of the electrodes 8. Thereby, bonding can be performed to the pad 10 from both sides of the connector, and the scope of the free layout of the foil conductor pattern 5 in the module and of the circuit constituting element can strikingly be enhanced. Therefore, the miniaturization and cost reduction of the power semiconductor module are facilitated.

Furthermore, according to the present embodiment, since the scope of free setting of the connector position is large, during the connecting of a plurality of semiconductor elements, particularly the switching elements such as the transistor 1 in parallel, a wiring inductance is balanced in each element, and the switching operation can be uniformed.

Figure 7:
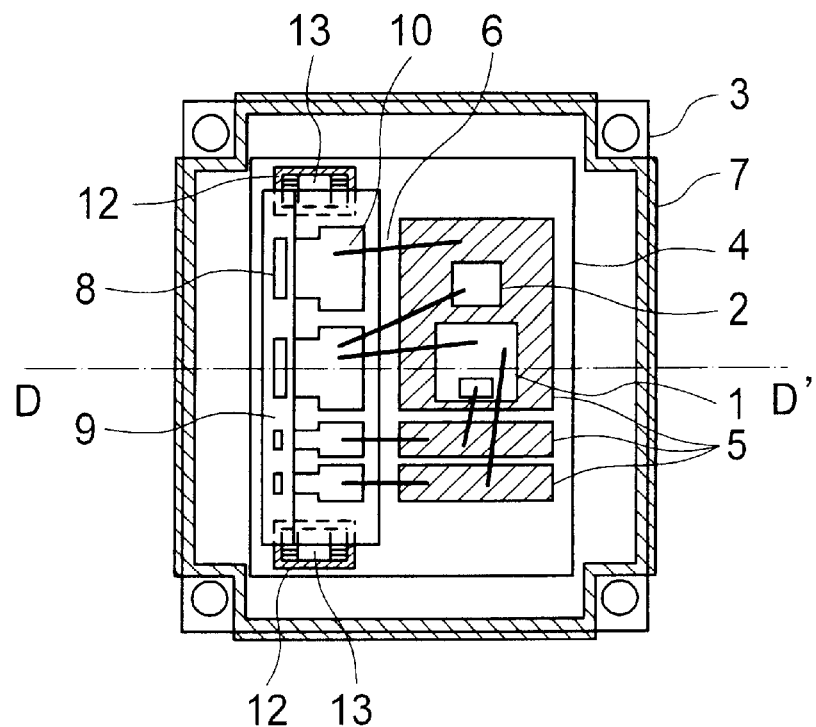
FIG. 7 is a top view showing a fourth embodiment.
Figure 8:
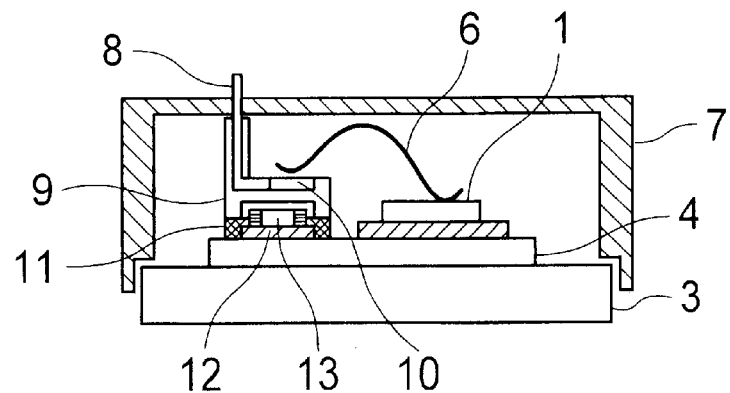
FIG. 8 is a sectional view taken along D–D' in FIG. 7.

FIG. 7 is a top view showing a fourth embodiment of the power semiconductor module according to the present invention, and FIG. 8 is a sectional view taken along a D–D' line in FIG. 7.

The embodiment in FIGS. 7 and 8 is different from the above-described embodiment in FIGS. 3 and 4 in that a jig 13 for determining the position to fix the connector onto the metal substrates 3 is soldered or fixed otherwise to a jig foil conductor pattern 12 disposed beforehand on the top surface of the metal substrate 3, and a hole 16 for the jig 13 is formed in a predetermined position on the bottom surface of the connector resin member 9. This can enhance the positioning precision of the connector when the module is assembled. Moreover, the thickness of the adhesive 11 for fixing the connector can precisely be set by adjusting the height of the jig 13 and the depth of the hole 16. Therefore, the yield can be improved, and the cost reduction and reliability enhancement are facilitated.

Figure 9:
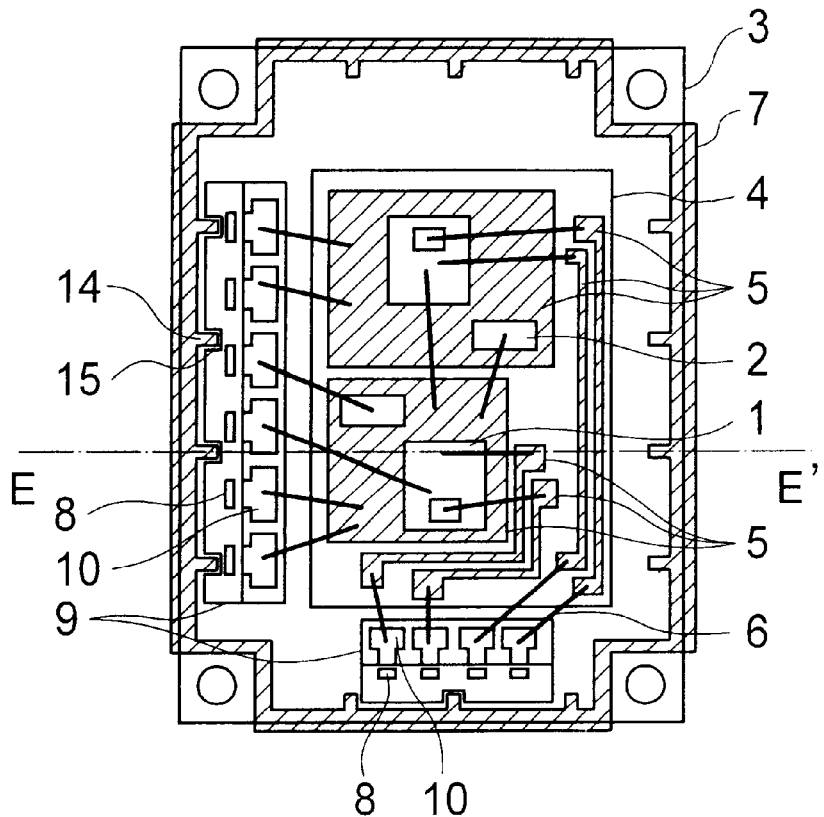
FIG. 9 is a top view showing a fifth embodiment.
Figure 10:
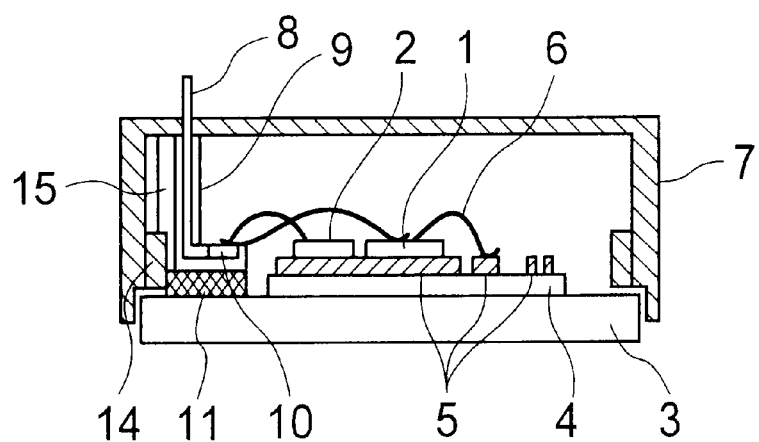
FIG. 10 is a sectional view taken along E–E' in FIG. 9.

FIG. 9 is a top view showing a fifth embodiment of the power semiconductor module according to the present invention, and FIG. 10 is a sectional view taken along a E–E' line in FIG. 9.

The embodiment in FIGS. 9 and 10 is different from the above-described embodiment in FIGS. 7 and 8 in that the jig for determining the position to fix the connector onto the metal substrate 3 is incorporated beforehand in the resin case 7 itself. Specifically, a plurality of protrusions 14 are disposed on predetermined positions of the inner side surface of the resin case 7, while on the connector side a plurality of grooves 15 for accommodating the protrusions 14 of the case are disposed on the predetermined positions of the contact surface of the resin member 9 and resin case 7 in the connector. This can enhance the positioning precision of the connector when the module is assembled. Furthermore, since a plurality of protrusions 14 and grooves 15 are prepared, the position of the connector can easily be moved in parallel, the scope of free layout is enhanced, the period for delivery can be shortened, and the yield improvement and dies-less process can be realized. Therefore, the power semiconductor module is presented with low cost and high reliability.

Figure 11:
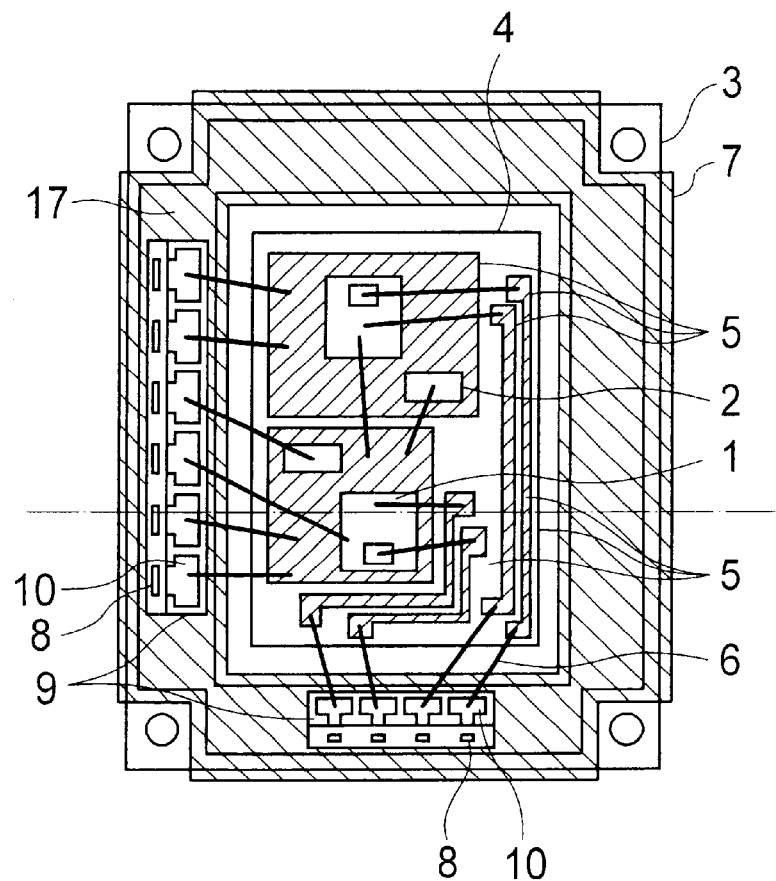
FIG. 11 is a top view showing a sixth embodiment.
Figure 12:
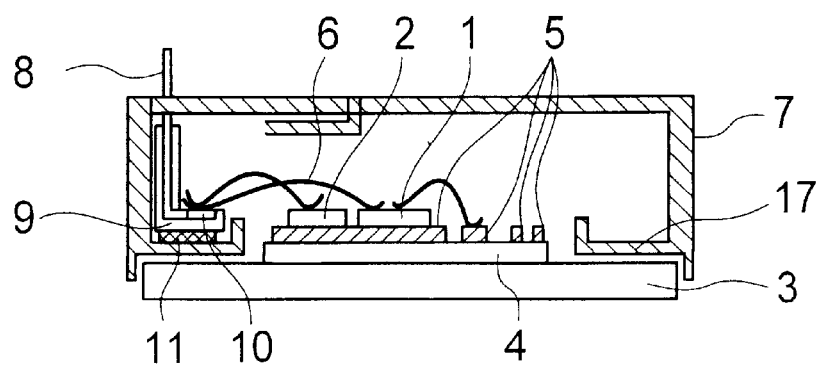
FIG. 12 is a sectional view taken along F–F' in FIG. 11.

FIG. 11 is a top view showing a sixth embodiment of the power semiconductor module according to the present invention, and FIG. 12 is a sectional view taken along a F–F' line in FIG. 11.

The embodiment in FIGS. 11 and 12 is different from the above-described embodiment in FIGS. 9 and 10 in that as the jig, incorporated beforehand in the resin case 7 itself, for determining the position to fix the connector, a tray part 17 for accommodating the connector is disposed on the entire inner periphery of the resin case 7. This can enhance the positioning precision of the connector when the module is assembled, the connector position can easily be moved in parallel, the scope of the free layout is enhanced, and the period for delivery can be shortened.

Figure 13:
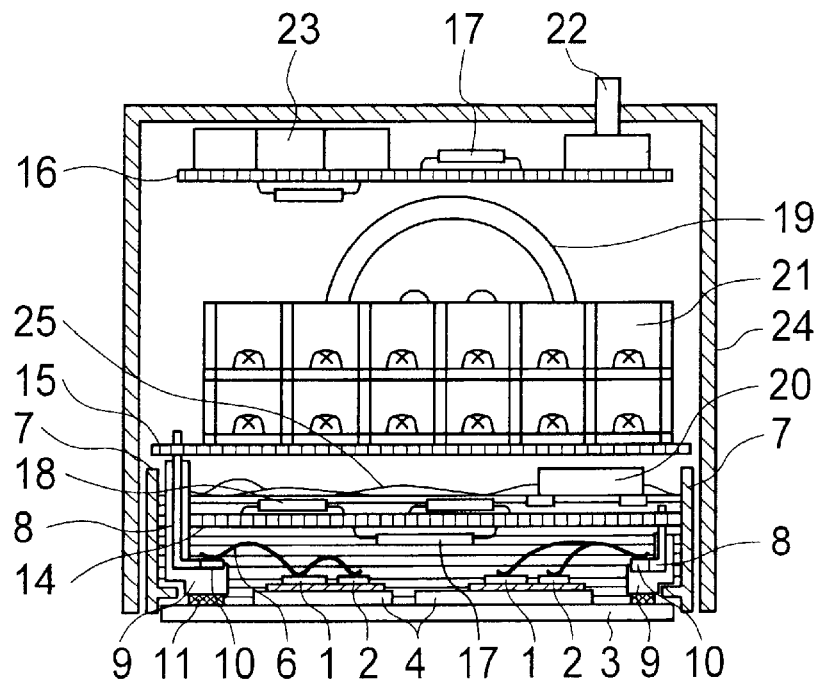
FIG. 13 is a sectional view showing a seventh embodiment.
Figure 14:
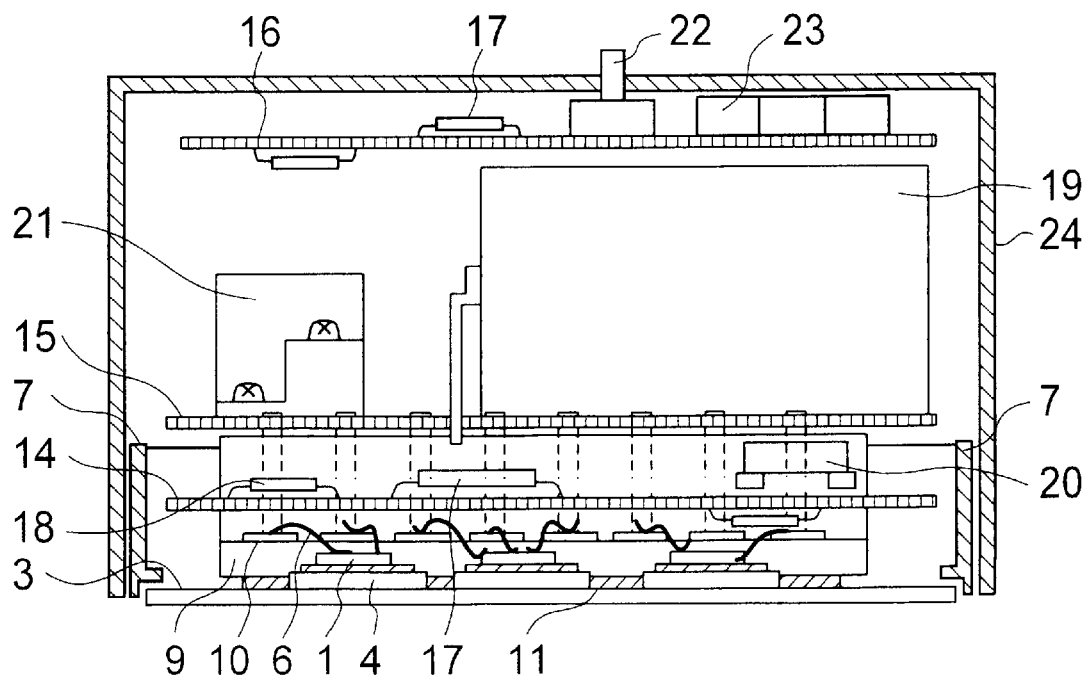
FIG. 14 is a sectional side view in FIG. 13.

FIG. 13 is a sectional view showing a power converting apparatus according to a seventh embodiment of the present invention, and FIG. 14 is a sectional side view.

In the power converting apparatus of the present embodiment, the power semiconductor module according to the present invention is disposed on the bottom part of a case 24. As shown in the above-described second to sixth embodiments, the present power semiconductor module is provided with a plurality of connectors in which the electrode 8 bent upward with respect to the surface of the pad 10 is covered with the resin member 9 separated from the resin case 7, and the connector resin member 9 is bonded to the metal substrate 3. Furthermore, incorporated in the present power semiconductor module is a printed wiring board 14 on which a microprocessor unit 17 for controlling the output properties of rotating machines such as an induction electric motor, a peripheral circuit thereof, a drive circuit 18 for driving the transistor 1 as a power semiconductor element, a controlling power circuit, and a transformer 20 are mounted. The printed wiring board 14 is positioned above a power circuit part provided with the transistor 1 and diode 2, and is electrically connected to the power circuit part via the connector electrode 8. Additionally, the power circuit part constitutes an inverter circuit for driving the rotating machine. The power semiconductor module is filled with a resin 25. The resin 25 covers and protects the power circuit part and printed wiring board 14. Positioned on the power semiconductor module is a printed wiring board 15 on which an electrolytic capacitor 19 for accumulating power to be supplied to the rotating machine and a terminal base 21 for connecting an output wiring to the rotating machine are mounted. The printed wiring board 15 is electrically connected to the power circuit part via the connector electrode 8. Furthermore, attached to the upper inner part of the case 24 is a user interface printed wiring board 16 on which the microprocessor unit 17 connected to a host control apparatus, various sensor circuits and user interface circuits, a volume resistance 22 for adjusting the output properties of the rotating machine, a display 23 for informing an operator of the operation state and the like of the power converting apparatus, and the like are mounted.

The present embodiment is characterized in that the printed wiring boards 14 and 15 are electrically connected to the power circuit part of the power semiconductor module via the connector as shown in the second to sixth embodiments. Particularly by using the solder in the electric connection of the connector and printed wiring board 14, an electric connection defect by the resin 25 for use in sealing the semiconductor module can be eliminated. Moreover, the height dimension of the connector for connecting the printed wiring board 15 to the power semiconductor module is larger than that of the connector for connecting the printed wiring board 15 to the power circuit part. Therefore, the printed wiring board 15 can be overlapped and disposed above the power semiconductor module. Therefore, the power converter can be miniaturized. Moreover, since the printed wiring board 15 can be overlapped and disposed on the power semiconductor module, a space for disposing other printed wiring boards such as the printed wiring board 16 of the present embodiment or other electric components is secured in the inner side surface and the upper part of the case 24. Therefore, even when a plurality of printed wiring boards and electric components other than the power semiconductor module are necessary, the power converting apparatus can be miniaturized.

By using the above-described connector, the conventional process of soldering the electrode 8 and the foil conductor pattern 5 can be omitted, and the reliability deterioration, such as destruction of the soldered surface and the insulating layer by the stress generated in the soldered part from the outside of the semiconductor module, is prevented. Moreover, since the electrode 8 is not directly incorporated in the resin case 7 for the module, the layout of the electrode 8 can easily be changed by freely selecting the position and the shape of the connector 9 and moving and changing the connector 9. Therefore, the scope of the free layout of the power semiconductor module electrode 8 can strikingly be enhanced, and the scope of the free layout of the components of the power converting apparatus using the power semiconductor module is strikingly enhanced, thereby, the miniaturization and customization are facilitated. Moreover, the stress to the electrode 8 generated by the expansion/contraction of the resin 25 covering the printed wiring board 14 incorporated in the power semiconductor module fails to destroy the insulating layer 4 and the foil conductor pattern on the insulating layer 4 because the electrode 8 is not fixed to the module internal circuit by the solder. Therefore, the power semiconductor module and power converting apparatus can be realized in which the deterioration of the dielectric strength hardly occurs, the reliability is high, and the customization is facilitated.

Figure 15:
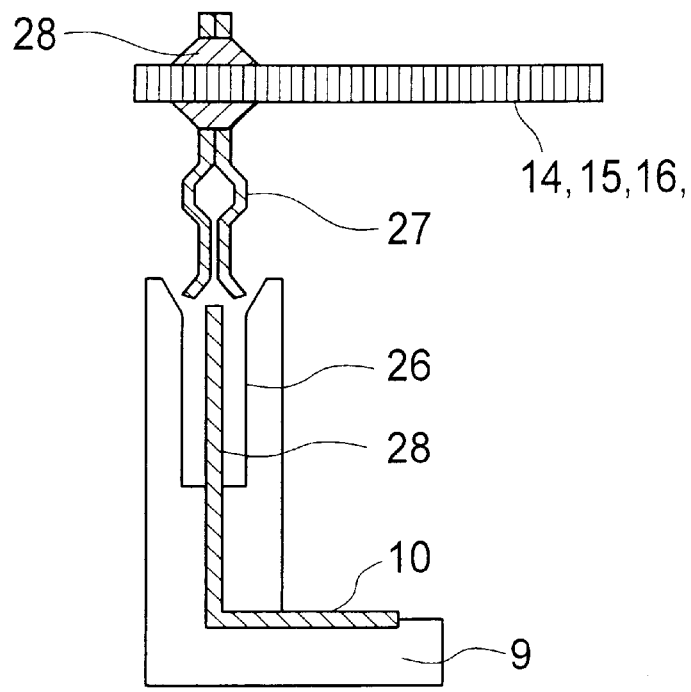
FIG. 15 is a sectional view showing an eighth embodiment.
Figure 16:
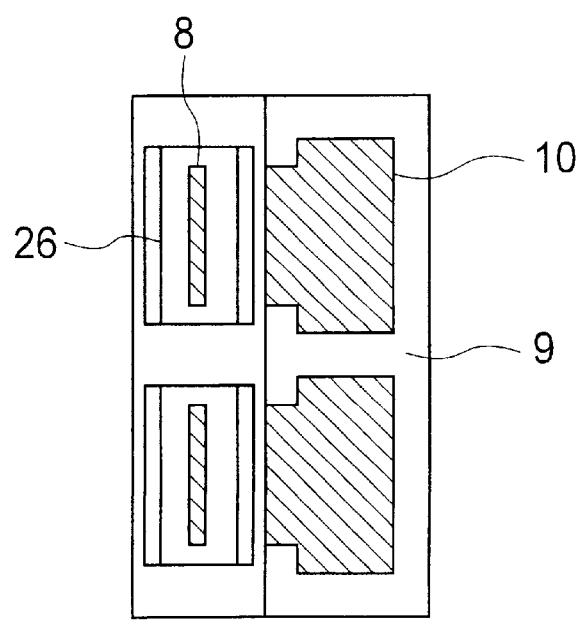
FIG. 16 is a top view in FIG. 15.
Figure 17:
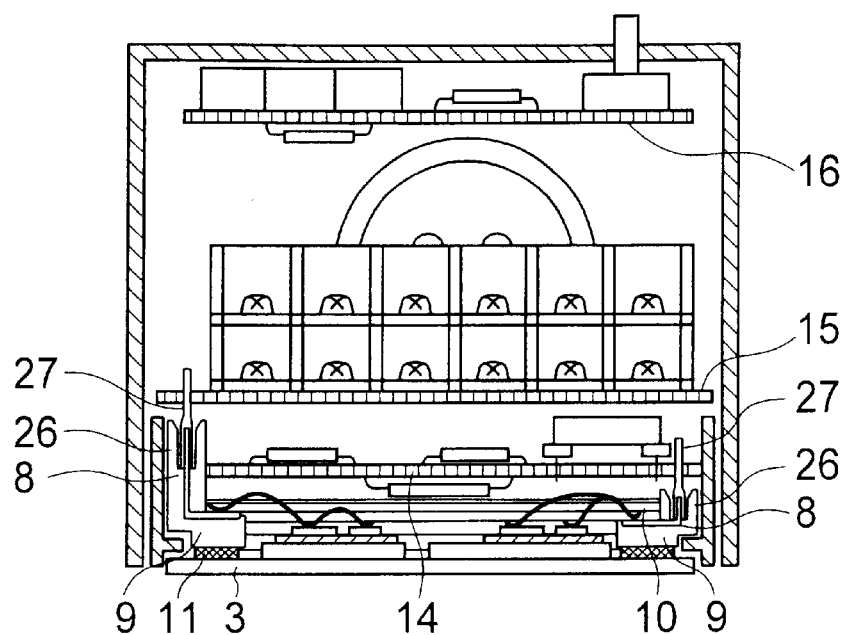
FIG. 17 is a sectional view of a power converting apparatus which uses the eighth embodiment.

FIGS. 15, 16, and 17 show an eighth embodiment of the present invention, and are a sectional view showing the electrode part of the power semiconductor module, a top view, and a sectional view of the power converting apparatus using the present power semiconductor module, respectively.

The present embodiment is different from the above-described embodiments in that the connector resin member 9 is provided with a plug type terminal base 26 and the printed wiring boards 14, 15 are provided with a connection terminal 27 so that the printed wiring boards 14, 15 are detachably attached and extractably inserted. The connection terminal 27 is detachably attached or extractably inserted and electrically connected to the connector electrode 8. The plug type terminal base 26 is constituted of a recess which is disposed in the connection part of the connection terminal 27 and electrode 8 in the part of the resin member 9 covering the upward directed part of the electrode 8. The connection part with the connection terminal 27 in the electrode 8 is positioned in the recess. Therefore, since the connection terminal 27 is inserted into the recess, the position of the terminal is fixed and the terminal is electrically connected to the electrode 8. Therefore, a current is stably passed between the connection terminal 27 and the electrode 8. Moreover, since the power circuit part on the metal substrate 3 and the printed wiring board 14, and the power semiconductor module and the printed wiring board 15 can be interconnected without using the solder, the reliability deterioration caused by the stress in the connected part can be prevented, and a highly reliable semiconductor module and power converting apparatus can be constituted. Moreover, when the printed wiring board 14 is installed in the semiconductor module case 7, the resin 25 is injected to a position lower than the plug type terminal base 26, in order to prevent the resin 25 from entering the plug type terminal base 26 disposed on the connector resin member 9. Thereby, since the printed wiring boards 14, 15 can easily be detached, during the occurrence of the defect, the replacement of the printed wiring boards is facilitated, and the yield is enhanced. Therefore, the cost reduction of the power semiconductor module and power converting apparatus using the power semiconductor module can be realized.

Figure 18:
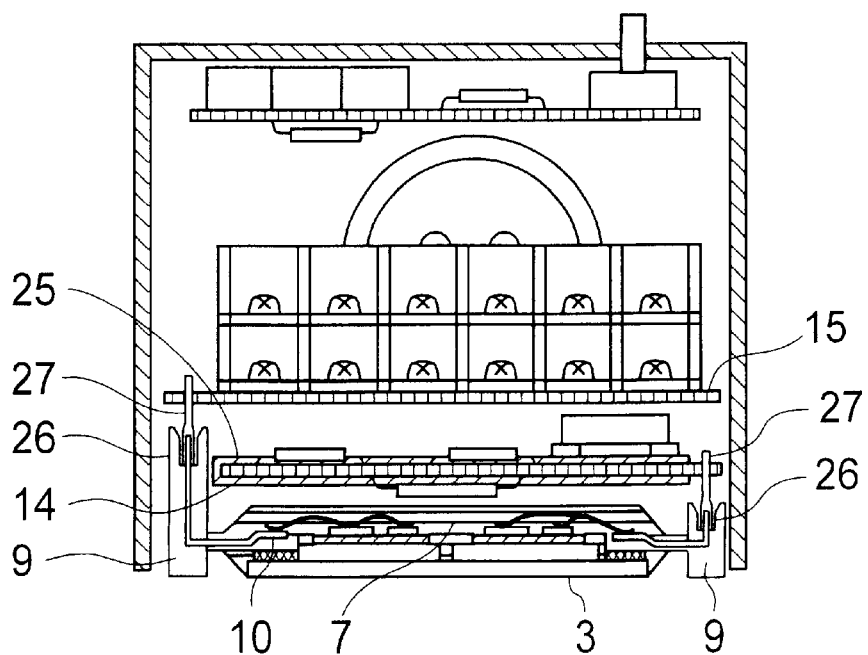
FIG. 18 is a sectional view showing a ninth embodiment.
Figure 19:
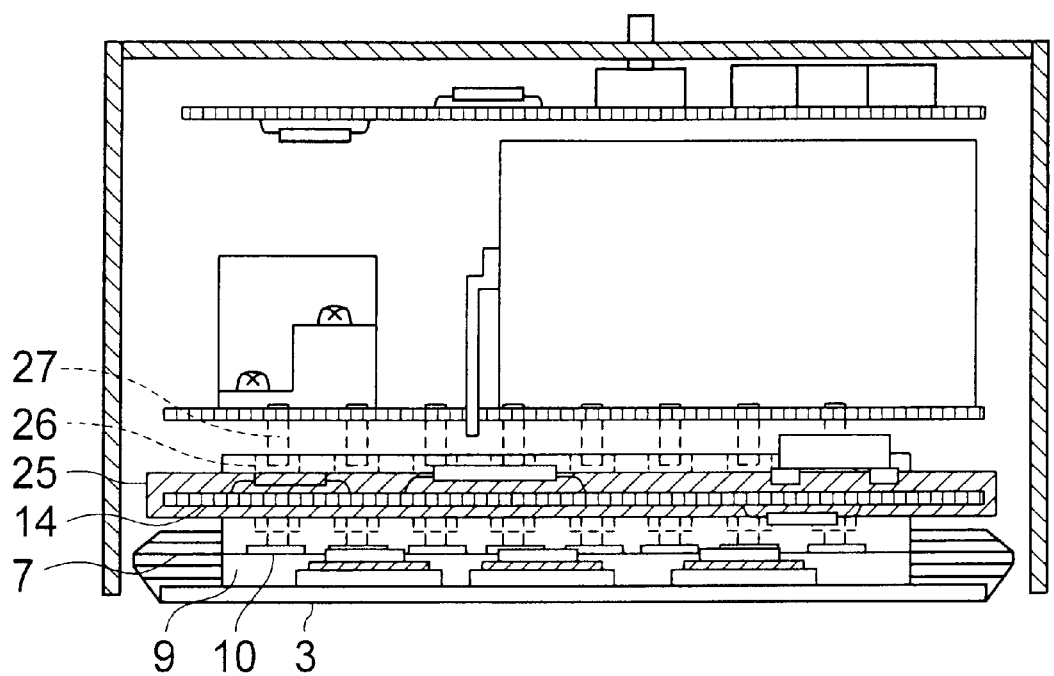
FIG. 19 is a sectional side view in FIG. 18.

FIG. 18 is a sectional view showing the power converting apparatus using the power semiconductor module according to the ninth embodiment of the present invention, and FIG. 19 is a sectional side view.

The present embodiment is different from the above-described embodiments first in that by molding resin, the resin case 7 of the power semiconductor module is integrally formed with the metal substrate 3 with the connector 9 and the power semiconductor element constituting the power circuit part mounted beforehand thereon. The connector resin member 9 includes the plug type terminal base 26 similar to that of the eighth embodiment. Furthermore, the connector resin member 9 in the present embodiment includes a horizontal part which extends to the outside of the top surface of the metal substrate in a horizontal direction parallel with the top surface of the metal substrate 3, and the plug type terminal base 26 similar to that of the eighth embodiment is disposed on a vertical part which extends in a direction vertical to the horizontal part and is positioned outside the molded resin case 7. The vertical part of the resin member 9 extends to the lower surface of the metal substrate 3 under the horizontal part. For the connector, the lower surface of the end of the horizontal part of the resin member 9 in the case 7 is bonded to the top surface of the metal substrate 3 by the adhesive. Moreover, the surface of the wire bonding pad 10 provided on the electrode 8 is exposed in the horizontal part of the resin member. The lead electrode is passed through the horizontal part and vertical part of the resin member 9, and extracted to the outside from the inside of the case 7. In the present embodiment, since the connector is configured as described above, and the horizontal part of the connector resin member 9 is held by the mold dies, the connector can easily be held in the mold dies, and the leakage of the resin from the mold dies can be prevented during the resin molding. Moreover, the position of the lead electrode of the power semiconductor module can be changed by changing the connector without changing the mold dies. Therefore, since the scope of the free layout of the lead electrode increases, the power semiconductor module and the power converting apparatus can be realized with low cost so that the customization is facilitated.

The eighth embodiment in FIGS. 18 and 19 is different from the above-described embodiments secondly in that since the connector is fixed to the case 7 by the molding resin, the process of bonding the connector to the metal substrate 3 can be simplified. In the bonding process, a small amount of adhesive 11 is applied to only a part of the connection surface of the connector and the metal substrate 3. Specifically, in the bonding process, the connector is tentatively bonded to the metal substrate 3 by the adhesive to such an extent that the positional relation of both does not deviate in the molding process, and a large bond strength is unnecessary. Therefore, since the adhesive applying process can be shortened and the use amount can be reduced, the low-cost semiconductor module and the power converting apparatus can be realized.

The eighth embodiment of FIGS. 18 and 19 is different from the above-described embodiments thirdly in that the printed wiring board 14 is covered with the resin 25 and the connection terminal 27 is protruded to the outside of the resin 25. Specifically, the printed wiring board 14 forms one module separate from the power circuit part, that is, a control circuit module. Similarly to the embodiment of FIG. 17, the connection terminal 27 is inserted to the plug type terminal base 26, fixed in the position and electrically connected to the lead electrode. Therefore, by using the power semiconductor module incorporating the power circuit part in common, and preparing a large number of control circuit module specifications in,which the detachable/attachable printed wiring board 14 is covered with the resin 25, various types and series of the power converting apparatuses are easily obtained, and the cost reduction of the power converting apparatus is achieved.

Figure 20:
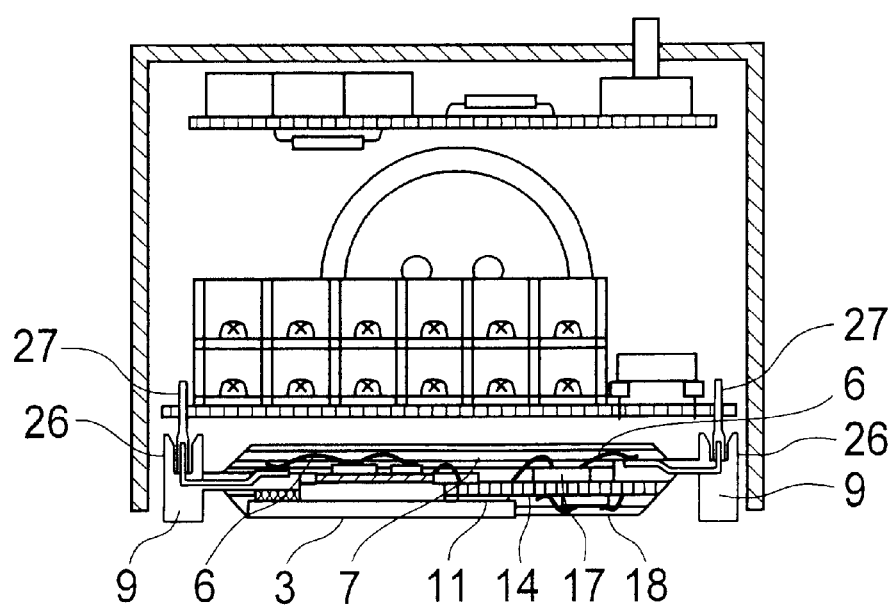
FIG. 20 is a sectional view showing a tenth embodiment.

FIG. 20 is a sectional view showing the power converting apparatus according to a tenth embodiment of the present invention.

The present embodiment is different from the embodiment of FIG. 18 in that the printed wiring board 14 with the microprocessor unit 17 and the drive circuit 18 for driving the power semiconductor element mounted thereon is molded together with the power circuit part by the resin case 7. Furthermore, in the present embodiment, the connector is bonded to the printed wiring board 14 by the adhesive 11. The power circuit part on the metal substrate 3 is electrically connected to the circuit on the printed wiring board 14 by wire bonding. Since the microprocessor unit 17 and the drive circuit 18 for driving the power semiconductor element are molded by the resin case 7, not only the coated package product but also bare chips can be mounted. According to the present embodiment, since the covering of the printed wiring board 14 with resin is unnecessary, the cost reduction of the power converting apparatus and the power semiconductor module can be realized. Moreover, by using the bare chips, the coating and packaging of the microprocessor unit 17, drive circuit 18, and the like individually with resin are unnecessary, which enables the miniaturization and cost reduction of the printed wiring board 14. Therefore, the miniaturization and cost reduction of the power converting apparatus and power semiconductor module can be realized.

In the power semiconductor modules and power converting apparatuses of the above described embodiments, various power semiconductor elements such as an insulating gate type bipolar transistor, a MOSFET, and a bipolar transistor can be used.

As described above, according to the present invention, the electrode layout can be performed without being influenced by the outer configuration of the power semiconductor module, the scope of the free construction and package of the circuit inside and outside the power semiconductor module is enhanced, and the miniaturization, cost reduction and reliability enhancement of the semiconductor module and the power converting apparatus using the semiconductor module can be achieved.

What is claimed is:

1. A semiconductor module with a semiconductor element mounted thereon, comprising: a connector in which a lead electrode is covered with a resin member separated from a semiconductor module case, and said lead electrode is provided with a wiring bonding pad bonding-connectable to a metal wire to connect said lead electrode to said semiconductor element, said resin member of the connector being bonded to the module.

2. The semiconductor module according to claim 1 wherein in said lead electrode, said pad is provided on a surface opposite to a contact surface of the lead electrode and said resin member.

3. The semiconductor module according to claim 1 wherein said lead electrode is bent with respect to said pad surface.

4. The semiconductor module according to claim 2 wherein the thickness of said resin member between said contact surface and the bonded part of said resin member in said module is in a range of 1 mm to 20 mm.

5. The semiconductor module according to claim 1 comprising: means for positioning said connector in the module.

6. The semiconductor module according to claim 1 wherein said connector is a connector for connecting a substrate on which an electric circuit component is mounted.

7. The semiconductor module according to claim 1 further comprising: a substrate with an electric circuit component mounted thereon, said substrate being positioned over said semiconductor element, sand substrate being connected to said connector.

8. The semiconductor module according to claim 7 wherein said substrate is disconnectably connected to said connector.

9. The semiconductor module according to claim 1 comprising:

a plurality of said connectors, the plurality of said connectors including a first connector, and a second connector higher than the first connector; and a substrate with an electric circuit component mounted thereon, said substrate being positioned over said semiconductor element, said substrate being connected to said first connector.

10. The semiconductor module according to claim 9 wherein said substrate is disconnectably connected to said first connector.

11. A power converting apparatus comprising:

the semiconductor module according to claim 1; and a substrate with an electric circuit component mounted thereon, said substrate being positioned above said semiconductor module, said substrate being connected to said connector.

12. A power converting apparatus comprising:

the semiconductor module according to claim 9; and another substrate with an electric circuit component mounted thereon, said another substrate being positioned above said semiconductor module, said another substrate being connected to said second connector.

13. The power converting apparatus according to claim 12 wherein said another substrate is disconnectably connected to said second connector.

14. A semiconductor module according to claim 1 wherein said semiconductor module case is comprised of resin.

* * * * *